(12) United States Patent
Jung

(10) Patent No.: US 8,644,089 B2
(45) Date of Patent: Feb. 4, 2014

(54) SEMICONDUCTOR MEMORY DEVICE

(75) Inventor: Taehyung Jung, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 46 days.

(21) Appl. No.: 13/524,524

(22) Filed: Jun. 15, 2012

(65) Prior Publication Data

US 2013/0336073 A1   Dec. 19, 2013

(51) Int. Cl.
*G11C 16/04* (2006.01)
(52) U.S. Cl.
USPC .......... 365/189.05; 365/230.06; 365/203
(58) Field of Classification Search
USPC ........ 365/189.05, 230.06, 203, 189.11, 233.1
See application file for complete search history.

(56) References Cited

U.S. PATENT DOCUMENTS 6,714,461 B2 *   3/2004   Matsumoto et al. ..... 365/189.05

* cited by examiner

*Primary Examiner* — David Lam
(74) *Attorney, Agent, or Firm* — IP & T Group LLP

(57) ABSTRACT

A semiconductor memory device selecting a half page based on a particular bit of a row address includes: an input unit for receiving the particular bit; a control signal generation unit for outputting a mode control signal in response to a signal related to a mode for selecting a whole page; first and second mode control units for transferring first and second output signals of the input unit corresponding to the particular bit and its inverse signal; a row precharge pulse generation unit for generating a row precharge pulse enabled in an initial period of a precharge duration; a first driving unit for pull-up/pull-down driving an output terminal corresponding to a first pre-decoding signal; a second driving unit for pull-up/pull-down driving an output terminal corresponding to a second pre-decoding signal; and first and second latch units for latching output signals of the first and second driving units.

20 Claims, 6 Drawing Sheets

SEMICONDUCTOR MEMORY DEVICE

BACKGROUND

1. Field

Exemplary embodiments of the present invention relate to a semiconductor designing technology, and more particularly, to a low pre-decoder circuit of a semiconductor memory device.

2. Description of the Related Art

Semiconductor memory devices including Dynamic Random Access Memory (DRAM) devices are using a row/column addressing scheme. First, a row address is inputted from the outside to select a row, which is a word line, and then a column address is inputted from the outside to select a column of the selected row, which is a bit line.

Conventionally, since there are many rows and columns, a method of decoding an address of multiple bits is being used. To taken an example of row addressing, a scheme where a pre-decoder is disposed in front of a main decoder and a word line driver to minimize the circuit area needed for a decoding circuit.

Meanwhile, word lines are generally formed of polysilicon to overcome technical limitation. However, since polysilicon has a high electrical resistance, a hierarchical structure of main word lines that are formed of metal and sub-word lines that are formed of polysilicon is being used. Generally, four sub-word lines are assigned to one main word line. The word line forming one page has a great loading in terms of a driving circuit, the sub-word lines are disposed over a half of one page. In other words, as illustrated in FIG. 1, which illustrates a pre-decoding scheme for selecting a half page by using the Most Significant Bit (MSB) of a row address, although word lines WL_L<0> and WL_R<0> form one page, they are disposed on a left block BLOCK_L and a right block BLOCK_R of each bank to form a half page, individually. Herein, row address-related signals LAX01, LAX23, ..., LAXD are the output signals of a row pre-decoder. Among the row address-related signals LAX01, LAX23, ..., LAXD, the row address-related signal LAXD selects the left block BLOCK_L and the right block BLOCK_R. The row address-related signal LAXD is a signal obtained by pre-decoding the most significant bit among the multiple bits that constitute the row address. For example, when the row address has 14 bits, the <0>$^{th}$ word line is selected based on an address A<0:12>, and the word line WL_L<0> of the left block BLOCK_L or the word line WL_R<0> of the right block BLOCK_R is selected based on the most significant bit, which is the address A<13>.

When there is an external interface that processes data in parallel, a plurality of data input/output pins are used. Generally, there are such data width options as X4 mode, X8 mode, and X16 mode. In case of the X4 mode, data are inputted/outputted through four data input/output pins among the data input/output pins. In case of the X8 mode, data are inputted/outputted through eight data input/output pins among the data input/output pins. The semiconductor memory device is designed to support all data width options, and the data width options are set through wire bonding or fuse option.

Meanwhile, when only a portion of the external data input/output pins is used, such as the X4 mode and the X8 mode, the left block BLOCK_L of FIG. 1 is used. However, as illustrated in X16 mode, when the entire external data input/output pins are to be used, both of the left block BLOCK_L and the right block BLOCK_R have to be selected simultaneously. Moreover, it does not have to distinguish the left block BLOCK_L and the right block BLOCK_R from each other for access when a row address is generated internally in a refresh operation duration, too.

Therefore, the unit pre-decoding circuit that corresponds to the MSB in the pre-decoder that receives the row address additionally includes a control circuit to select the whole page in the X16 mode or the refresh mode, differently from the unit pre-decoding circuit that corresponds to the other lower bits.

FIG. 2 is a circuit diagram illustrating a conventional row pre-decoder. The drawing shows a unit pre-decoding circuit that corresponds to the most significant bit of the pre-decoder.

Referring to FIG. 2, the conventional pre-decoding circuit includes an input unit 200, a control signal generation unit 240, a first mode control unit 210, a second mode control unit 215, a first driving unit 220, a second driving unit 225, a first latch unit 230, and a second latch unit 235. The input unit 200 receives a row address XA<13> in response to a bank active pulse BAP and a row address enable pulse XAEP. The control signal generation unit 240 outputs a mode control signal MODECTRL in response to a refresh signal REF and an X16 mode signal SIG_X16. The first mode control unit 210 transfers a first output signal of the input unit 200 corresponding to the row address XA<13> in response to the mode control signal MODECTRL. The second mode control unit 215 transfers a second output signal of the input unit 200 corresponding to an inverse signal of the row address XA<13> in response to the mode control signal MODECTRL. The first driving unit 220 pull-up/pull-down drives an output terminal that corresponds to a first pre-decoding signal LAXD<0> in response to a row active signal R3ACB and the output signal of the first mode control unit 210. The second driving unit 225 pull-up/pull-down drives an output terminal that corresponds to a second pre-decoding signal LAXD<1> in response to the row active signal R3ACB and the output signal of the second mode control unit 215. The first latch unit 230 latches the output signal of the first driving unit 220, and the second latch unit 235 latches the output signal of the second driving unit 225.

Herein, the input unit 200 includes a NAND gate ND1, an inverter IN0, an inverter IN1, an inverter IN2, a NAND gate ND2, and a NAND gate ND3. The NAND gate ND1 receives the row address XA<13> and the bank active pulse BAP. The inverter IN0 receives the output signal of the NAND gate ND1. The inverter IN1 receives the output signal of the inverter IN0. The inverter IN2 forms an inverse latch together with the inverter IN1. The NAND gate ND2 receives the output signal of the inverter IN1 and the row address enable pulse XAEP. The NAND gate ND3 receives the output signal of the inverter IN0 and the row address enable pulse XAEP.

The control signal generation unit 240 includes a NOR gate NR1 that receives the refresh signal REF and the X16 mode signal SIG_X16 and receives the mode control signal MODECTRL.

The first mode control unit 210 includes a NAND gate ND4 and an inverter IN3. The NAND gate ND4 receives the mode control signal MODECTRL and a first output signal of the input unit 200. The inverter IN3 receives the output signal of the NAND gate ND4.

The second mode control unit 215 includes a NAND gate ND5 and an inverter IN4. The NAND gate ND5 receives the mode control signal MODECTRL and a second output signal of the input unit 200. The inverter IN4 receives the output signal of the NAND gate ND5.

The first driving unit 220 includes a PMOS transistor MP0, a PMOS transistor MP1, and an NMOS transistor MN0. The PMOS transistor MP0 includes a source coupled with a power source voltage VDD terminal and a gate for receiving the output signal of the first mode control unit 210. The PMOS transistor MP1 includes a source coupled with a drain of the PMOS transistor MP0, a drain coupled with an output terminal, and a gate for receiving the row active signal R3ACB. The NMOS transistor MN0 includes a source coupled with a ground voltage VSS terminal, a drain coupled with an output terminal, and a gate for receiving the row active signal R3ACB.

The second driving unit 225 includes a PMOS transistor MP2, a PMOS transistor MP3, and an NMOS transistor MN1. The PMOS transistor MP2 includes a source coupled with a power source voltage VDD terminal and a gate for receiving the output signal of the second mode control unit 215. The PMOS transistor MP3 includes a source coupled with a drain of the PMOS transistor MP2, a drain coupled with an output terminal, and a gate for receiving the row active signal R3ACB. The NMOS transistor MN1 includes a source coupled with a ground voltage VSS terminal, a drain coupled with an output terminal, and a gate for receiving the row active signal R3ACB.

The first latch unit 230 includes an inverter IN5, an inverter IN6, and an inverter IN7. The inverter IN5 receives the output signal of the first driving unit 220. The inverter IN6 forms an inverse latch together with the inverter IN5. The inverter IN7 receives the output signal of the inverter IN5 and outputs the first pre-decoding signal LAXD<0>.

The second latch unit 235 includes an inverter IN8, an inverter IN9, and an inverter IN10. The inverter IN8 receives the output signal of the second driving unit 225. The inverter IN9 forms an inverse latch together with the inverter IN8. The inverter IN10 receives the output signal of the inverter IN8 and outputs the second pre-decoding signal LAXD<1>.

FIGS. 3A and 3B are timing diagrams of the row pre-decoding circuit illustrated in FIG. 2. The operation of the row pre-decoding circuit illustrated in FIG. 2 is described with reference to the drawings.

First of all, FIG. 3A illustrates the semiconductor memory device performing a normal-mode operation in the X4 mode or the X8 mode.

Referring to FIG. 3A, when an active command is applied, the bank active pulse BAP is enabled to a logic high level, and then the row address enable pulse XAEP is enabled to a logic high level. Therefore, the first output signal of the input unit 200 is outputted in the same logic level as the row address XA<13>, and the second output signal of the input unit 200 is outputted in the opposite logic level as the row address XA<13>.

The refresh signal REF is a signal that is enabled to a logic high level in a refresh duration and it is disabled to a logic low level in a normal mode. Also, since the mode is not the X16 mode, the X16 mode signal SIG_X16 is disabled to a logic low level as well. Therefore, the mode control signal MODECTRL is of a logic high level, and the first mode control unit 210 and the second mode control unit 215 transfer the first and second output signals of the input unit 200 as they are.

The row active signal R3ACB receives the active command to be enabled to a logic low level, and it receives a precharge command to be disabled to a logic high level. Herein, since the row active signal R3ACB is enabled to a logic low level, the PMOS transistor MP1 of the first driving unit 220 and the PMOS transistor MP3 of the second driving unit 225 are turned on. Therefore, the PMOS transistor MP0 of the first driving unit 220 and the PMOS transistor MP2 of the second driving unit 225 are selectively turned on according to the row address XA<13>.

After all, the first pre-decoding signal LAXD<0> and the second pre-decoding signal LAXD<1> that are outputted from the first latch unit 230 and the second latch unit 235 selectively transition to a logic high level according to the logic level of the row address XA<13>, and another signal maintains its logic level in the logic low level. This is because the first latch unit 230 and the second latch unit 235 are initialized to a logic low level based on the row active signal R3ACB that is disabled to a logic high level in the precharge operation before the reception of the active command.

Meanwhile, when the precharge command is applied, the row active signal R3ACB is disabled to a logic low level. Therefore, the first pre-decoding signal LAXD<0> and the second pre-decoding signal LAXD<1> that are outputted from the first latch unit 230 and the second latch unit 235 are all initialized to a logic low level regardless of the row address XA<13>.

The drawings show a case where the row address XA<13> is in a logic low level, and during the active operation, the first pre-decoding signal LAXD<0> is in a logic high level and the second pre-decoding signal LAXD<1> is in a logic low level. However, when the row address XA<13> is in a logic high level, the polarity of the signals becomes the opposite.

As described above, when the semiconductor memory device is set in the X4 mode or the X8 mode and performs a normal-mode operation, any one between the first pre-decoding signal LAXD<0> and the second pre-decoding signal LAXD<1> transitions to a logic high level. As described earlier, the MSB, e.g., address A<13>, of the row address selects the half page to be enabled. Therefore, a word line of the left block BLOCK_L or a word line of the right block BLOCK_R shown in FIG. 1 is selectively enabled according to the logic level of the first pre-decoding signal LAXD<0> and the second pre-decoding signal LAXD<1>.

Subsequently, FIG. 3B illustrates an operation in a refresh mode when the semiconductor memory device is set in the X16 mode, or when the semiconductor memory device is set in the X4 mode or the X8 mode.

Referring to FIG. 3B, when the active command is applied, the bank active pulse BAP is enabled to a logic high level, and then the row address enable pulse XAEP is enabled to a logic high level. Therefore, the first output signal of the input unit 200 is outputted in the same logic level as that of the row address XA<13>, and the second output signal of the input unit 200 is outputted in the opposite logic level to the logic level of the row address XA<13>.

When the semiconductor memory device is set in the X16 mode, the X16 mode signal SIG_X16 always maintains its logic state to be enabled in a logic high level. Also, when the semiconductor memory device is set in the X4 mode or the X8 mode, the X16 mode signal SIG_X16 is disabled to a logic low level, but the refresh signal REF is enabled to a logic high level during a refresh operation. Therefore, when the semiconductor memory device is set in the X16 mode or when the semiconductor memory device is set in the X4 mode or the X8 mode and the mode is a refresh mode, the mode control signal MODECTRL is in a logic low level while the first mode control unit 210 and the second mode control unit 215 output a signal of a logic low level regardless of the first and second output signals of the input unit 200.

Since the row active signal R3ACB is enabled to a logic low level during an active operation, the PMOS transistor MP1 of the first driving unit 220 and the PMOS transistor MP3 of the second driving unit 225 are turned on. Herein, since the output signals of the first mode control unit 210 and the second mode control unit 215 are all of a logic low level regardless of the row address XA<13>, the PMOS transistor MP0 of the first driving unit 220 and the PMOS transistor MP2 of the second driving unit 225 are all turned on.

After all, since the first pre-decoding signal LAXD<0> and the second pre-decoding signal LAXD<1> that are outputted from the first latch unit 230 and the second latch unit 235 all transition to a logic high level.

Meanwhile, when a precharge command is applied, the row active signal R3ACB is disabled to a logic low level. Therefore, the first pre-decoding signal LAXD<0> and the second pre-decoding signal LAXD<1> that are outputted from the first latch unit 230 and the second latch unit 235 are all initialized to a logic low level, regardless of the row address XA<13>.

As described above, when the semiconductor memory device is set in the X16 mode, both of the first pre-decoding signal LAXD<0> and the second pre-decoding signal LAXD<1> toggle to a logic high level whenever a bank is activated, regardless of the operation mode; and an operation that the first pre-decoding signal LAXD<0> and the second pre-decoding signal LAXD<1> toggle to a logic low level is performed repeatedly whenever the bank is precharged. Also, although the semiconductor memory device is set in the X4 mode or the X8 mode, if a refresh operation is continuously performed, both of the first pre-decoding signal LAXD<0> and the second pre-decoding signal LAXD<1> toggle to a logic high level whenever a bank is activated; and whenever the bank is precharged, the operation that the first pre-decoding signal LAXD<0> and the second pre-decoding signal LAXD<1> toggle to a logic low level is performed repeatedly. Herein, when the semiconductor memory device gets out of the refresh mode, both of the first pre-decoding signal LAXD<0> and the second pre-decoding signal LAXD<1> are all initialized to a logic low level, and then the semiconductor memory device performs the operation of FIG. 3A afterwards.

When the semiconductor memory device is set in the X16 mode, the entire page is selected; or although the semiconductor memory device is set in the X4 mode or X8 mode, if the mode is a refresh mode, the entire page is selected basically. Therefore, although it does not have to select a half page, initializing the first pre-decoding signal LAXD<0> and the second pre-decoding signal LAXD<1> to a logic low level whenever a bank is precharged after the bank is activated requires unnecessary toggling, which means unnecessary current consumption.

SUMMARY

An embodiment of the present invention is directed to a semiconductor memory device that may prevent current consumption caused by unnecessary toggling in a pre-decoding circuit which selects a half page by using some bits of a row address.

In accordance with an embodiment of the present invention, a semiconductor memory device that selects a half page based on a particular bit of a row address includes: an input unit configured to receive the particular bit of the row address in response to a bank active pulse and a row address enable pulse; a control signal generation unit configured to output a mode control signal in response to a signal related to a mode for selecting a whole page; first and second mode control units configured to transfer a first output signal and a second output signal of the input unit that correspond to the particular bit of the row address and an inverse signal thereof, respectively, in response to the mode control signal; a row precharge pulse generation unit configured to generate a row precharge pulse that is enabled in an initial period of a precharge duration in response to the mode control signal and a row active signal; a first driving unit configured to pull-up/pull-down drive an output terminal that corresponds to a first pre-decoding signal in response to the row precharge pulse and an output signal of the first mode control unit; a second driving unit configured to pull-up/pull-down drive an output terminal that corresponds to a second pre-decoding signal in response to the row precharge pulse and an output signal of the second mode control unit; and first and second latch units configured to latch output signals of the first driving unit and the second driving unit, respectively.

In accordance with another embodiment of the present invention, a semiconductor memory device that selects a half page based on a particular bit of a row address includes: an input unit configured to receive the particular bit of the row address in response to a bank active pulse and a row address enable pulse; a control signal generation unit configured to output a mode control signal in response to a signal related to a mode for selecting a whole page; first and second mode control units configured to transfer a first output signal and a second output signal of the input unit that correspond to the particular bit of the row address and an inverse signal thereof, respectively, in response to the mode control signal; a first driving unit configured to drive an output terminal that corresponds to a first pre-decoding signal, where the first driving unit includes a pull-up element that is controlled based on the row active signal and an output signal of the first mode control unit and a pull-down element that is controlled based on the row active signal and the mode control signal; a second driving unit configured to drive an output terminal that corresponds to a second pre-decoding signal, where the second driving unit includes a pull-up element that is controlled based on the row active signal and an output signal of the second mode control unit and a pull-down element that is controlled based on the row active signal and the mode control signal; and first and second latch units configured to latch output signals of the first driving unit and the second driving unit, respectively.

DETAILED DESCRIPTION

Figure 1:
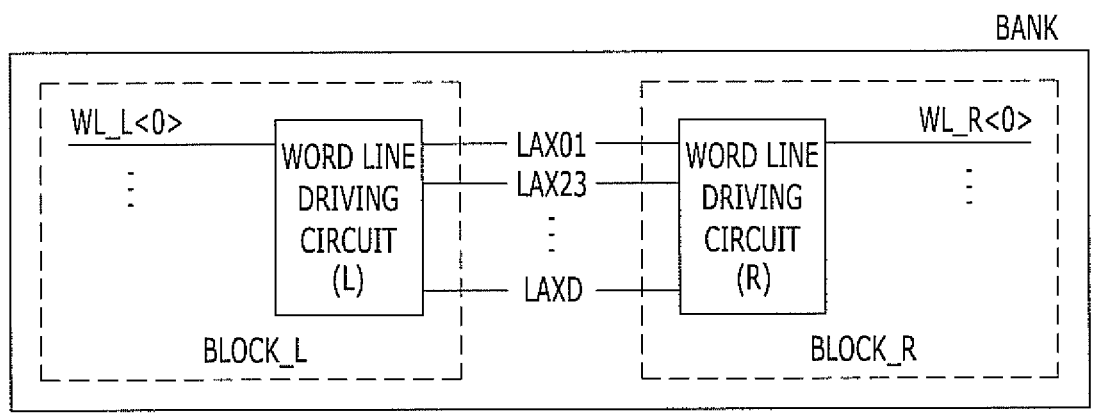
FIG. 1 illustrates a pre-decoding scheme for selecting a half page by using the Most Significant Bit (MSB) of a row address.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 4:
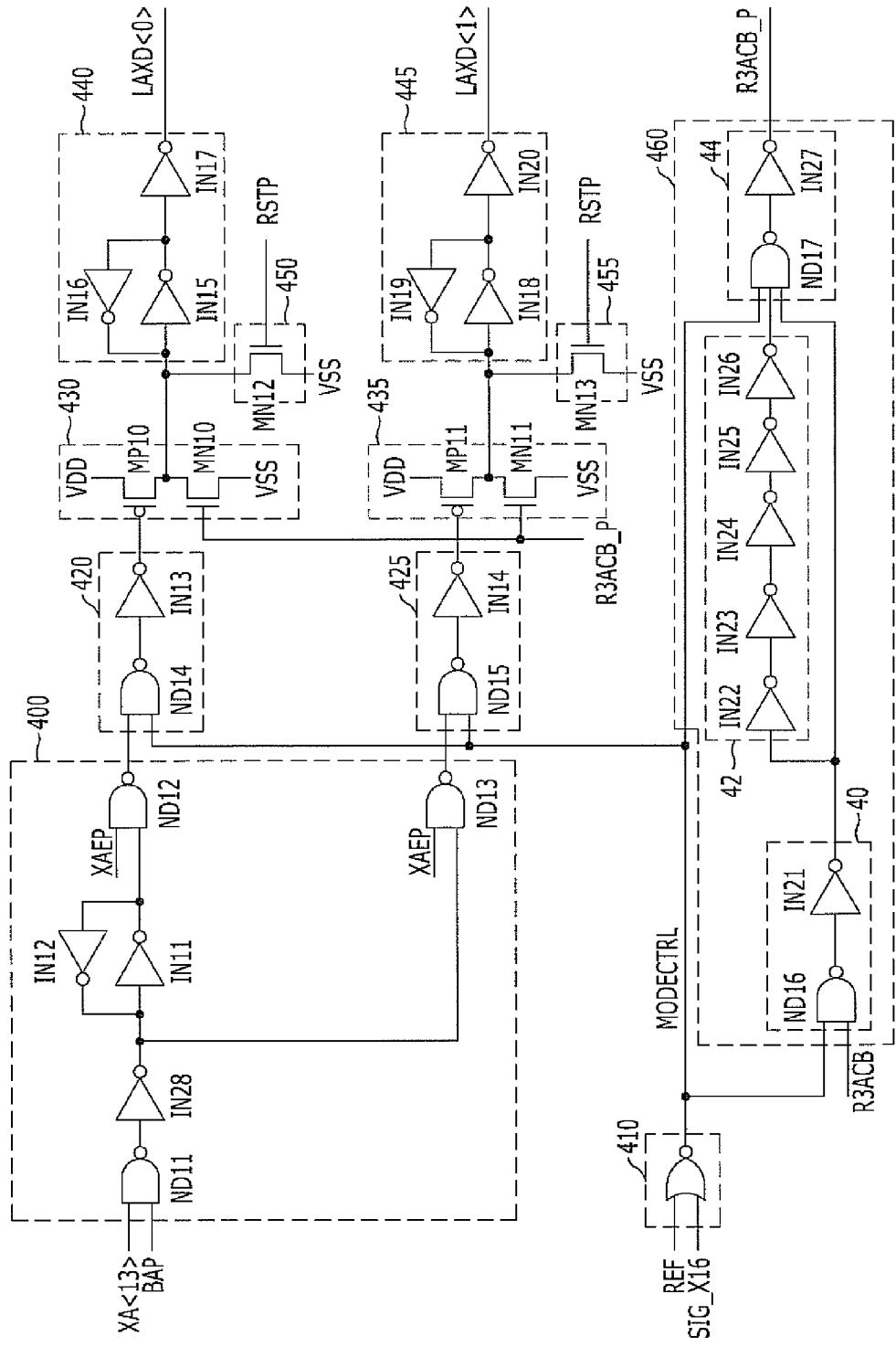
FIG. 4 is a circuit diagram of a row pre-decoding circuit in accordance with an embodiment of the present invention.

FIG. 4 is a circuit diagram of a row pre-decoding circuit in accordance with an embodiment of the present invention. The drawing shows a unit pre-decoding circuit that corresponds to the MSB of the pre-decoder.

Referring to FIG. 4, the conventional pre-decoding circuit includes an input unit 400, a control signal generation unit 410, a first mode control unit 420, a second mode control unit 425, a row precharge pulse generation unit 460, a first driving unit 430, a second driving unit 435, a first latch unit 440, and a second latch unit 445. The input unit 400 receives a row address XA<13> in response to a bank active pulse BAP and a row address enable pulse XAEP. The control signal generation unit 410 outputs a mode control signal MODECTRL in response to a refresh signal REF and an X16 mode signal SIG_X16. The first mode control unit 420 transfers a first output signal of the input unit 400 corresponding to the row address XA<13> in response to the mode control signal MODECTRL. The second mode control unit 425 transfers a second output signal of the input unit 400 corresponding to an inverse signal of the row address XA<13> in response to the mode control signal MODECTRL. The row precharge pulse generation unit 460 generates a row precharge pulse R3ACB_P that is temporarily enabled in the initial period of a precharge duration in response to the mode control signal MODECTRL and a row active signal R3ACB. The first driving unit 430 pull-up/pull-down drives an output terminal that corresponds to a first pre-decoding signal LAXD<0> in response to the row precharge pulse R3ACB_P and the output signal of the first mode control unit 420. The second driving unit 435 pull-up/pull-down drives an output terminal that corresponds to a second pre-decoding signal LAXD<1> in response to the row precharge pulse R3ACB_P and the output signal of the second mode control unit 425. The first latch unit 440 latches the output signal of the first driving unit 430, and the second latch unit 445 latches the output signal of the second driving unit 435.

Meanwhile, the unit pre-decoding circuit in accordance with the embodiment of the present invention may further include a first reset unit 450 and a second reset unit 455. The first reset unit 450 resets the first latch unit 440 in response to a reset pulse RSTPB, and the second reset unit 455 resets the second latch unit 445 in response to a reset pulse RSTPB.

Herein, the input unit 400 includes a NAND gate ND11, an inverter IN28, an inverter IN11, an inverter IN12, a NAND gate ND12, and a NAND gate ND13. The NAND gate ND11 receives the row address XA<13> and the bank active pulse BAP. The inverter IN28 receives the output signal of the NAND gate ND11. The inverter IN11 receives the output signal of the inverter IN28. The inverter IN12 forms an inverse latch together with the inverter IN11. The NAND gate ND12 receives the output signal of the inverter IN11 and the row address enable pulse XAEP. The NAND gate ND13 receives the output signal of the inverter IN28 and the row address enable pulse XAEP.

The control signal generation unit 410 includes a NOR gate NR1 that receives the refresh signal REF and the X16 mode signal SIG_X16 and outputs the mode control signal MODECTRL.

The first mode control unit 420 includes a NAND gate ND14 and an inverter IN13. The NAND gate ND14 receives the mode control signal MODECTRL and a first output signal of the input unit 400. The inverter IN13 receives the output signal of the NAND gate ND14.

The second mode control unit 425 includes a NAND gate ND15 and an inverter IN14. The NAND gate ND15 receives the mode control signal MODECTRL and a second output signal of the input unit 400. The inverter IN14 receives the output signal of the NAND gate ND15.

The first driving unit 430 includes a PMOS transistor MP10 and an NMOS transistor MN10. The PMOS transistor MP10 includes a source coupled with a power source voltage VDD terminal, a drain coupled with an output terminal, and a gate for receiving the output signal of the first mode control unit 420. The NMOS transistor MN10 includes a source coupled with a ground voltage VSS terminal, a drain coupled with an output terminal, and a gate for receiving the row precharge pulse R3ACB_P.

The second driving unit 435 includes a PMOS transistor MP11, and an NMOS transistor MN11. The PMOS transistor MP11 includes a source coupled with a power source voltage VDD terminal, a drain coupled with an output terminal, and a gate for receiving the output signal of the second mode control unit 425. The NMOS transistor MN11 includes a source coupled with a ground voltage VSS terminal, a drain coupled with an output terminal, and a gate for receiving the row precharge pulse R3ACB_P.

The first latch unit 440 includes an inverter IN15, an inverter IN16, and an inverter IN17. The inverter IN15 receives the output signal of the first driving unit 430. The inverter IN16 forms an inverse latch together with the inverter IN15. The inverter IN17 receives the output signal of the inverter IN15 and outputs the first pre-decoding signal LAXD<0>.

The second latch unit 445 includes an inverter IN18, an inverter IN19, and an inverter IN20. The inverter IN18 receives the output signal of the second driving unit 435. The inverter IN19 forms an inverse latch together with the inverter IN1. The inverter IN20 receives the output signal of the inverter IN1 and outputs the second pre-decoding signal LAXD<1>.

The first reset unit 450 includes an NMOS transistor MN12 which includes a source coupled with the ground voltage VSS terminal, a drain coupled with an output terminal of the first driving unit 430, and a gate for receiving the reset pulse RSTPB.

The second reset unit 455 includes an NMOS transistor MN13 which includes a source coupled with the ground voltage VSS terminal, a drain coupled with an output terminal of the second driving unit 435, and a gate for receiving the reset pulse RSTPB.

The row precharge pulse generation unit 460 includes a transferring element 40, an inverse delaying element 42, and an output element 44. The transferring element 40 selectively transfers a row active signal R3ACB in response to the mode control signal MODECTRL. The inverse delaying element 42 inverses and delays the output signal of the transferring element 40 by a predetermined delay amount. The output element 44 receives the mode control signal MODECTRL, the output signal of the transferring element 40, and the output signal of the inverse delaying element 42, and outputs the row precharge pulse R3ACB_P.

Herein, the transferring element 40 may include a NAND gate ND16 and an inverter IN21. The NAND gate ND16 receives the mode control signal MODECTRL and the row active signal R3ACB. The inverter IN21 receives the output signal of the NAND gate ND16.

The inverse delaying element 42 may include an inverter chain of inverters IN22, IN23, IN24, IN25 and IN26 that receives the output signal of the transferring element 40. The inverse delaying element 42 may include an odd number of inverters to invert an input signal, and the number of the inverters is decided according to the pulse width of the row precharge pulse R3ACB_P.

The output element 44 may include a NAND gate ND17 and an inverter IN17. The NAND gate ND17 receives the mode control signal MODECTRL, the output signal of the transferring element 40, and the output signal of the inverse delaying element 42. The inverter IN17 receives the output signal of the NAND gate ND17.

Figure 5A:
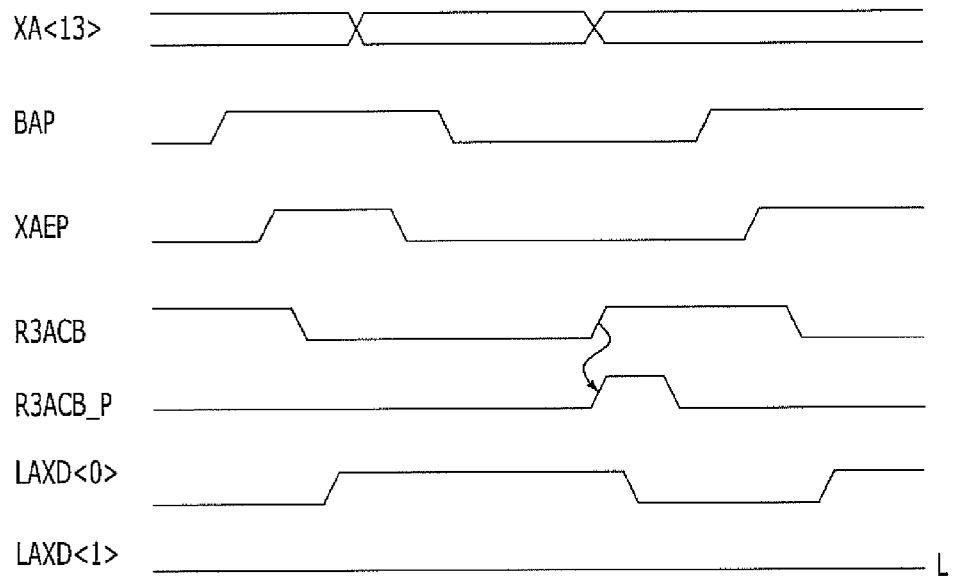
FIGS. 5A and 5B are timing diagrams of the row pre-decoding circuit illustrated in FIG. 4.
Figure 5B:
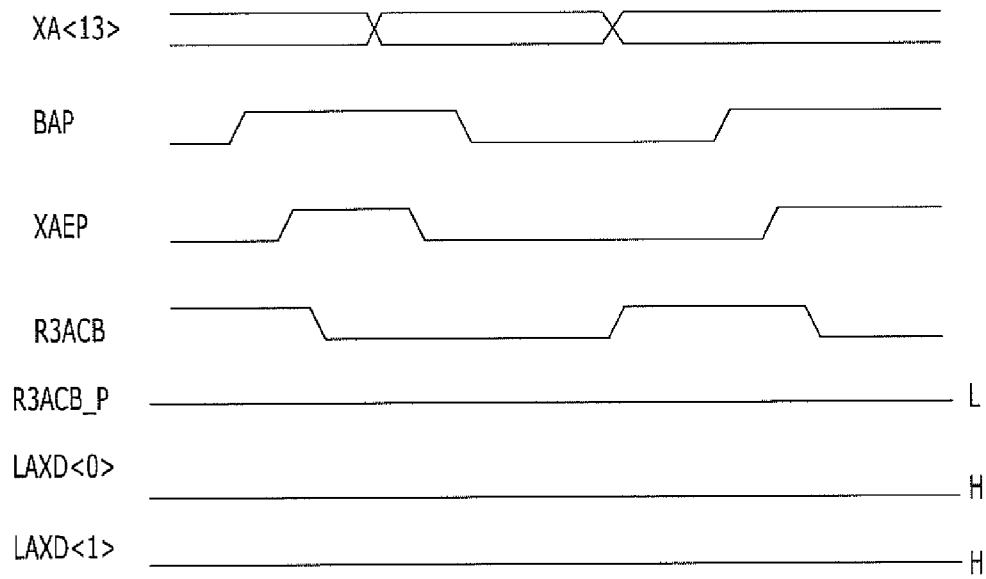

FIGS. 5A and 5B are timing diagrams of the row pre-decoding circuit illustrated in FIG. 4. The operation of the row pre-decoding circuit illustrated in FIG. 4 is described with reference to the drawings.

First of all, FIG. 5A illustrates the semiconductor memory device performing a normal-mode operation in the X4 mode or the X8 mode.

Referring to FIG. 5A, when an active command is applied, the bank active pulse BAP is enabled to a logic high level, and then the row address enable pulse XAEP is enabled to a logic high level. Therefore, the first output signal of the input unit 400 is outputted in the same logic level as the row address XA<13>, and the second output signal of the input unit 400 is outputted in the opposite logic level as the row address XA<13>.

Since the mode is a normal mode, the refresh signal REF is disabled to a logic low level, and since the mode is not the X16 mode, the X16 mode signal SIG_X16 is disabled to a logic low level as well. Therefore, the mode control signal MODECTRL is in a logic high level.

Since the mode control signal MODECTRL is in a logic high level, the first mode control unit 420 and the second mode control unit 425 transfer the first and second output signals of the input unit 400 as they are. Therefore, the PMOS transistor MP10 of the first driving unit 430 or the PMOS transistor MP11 of the second driving unit 435 is selectively turned on according to the row address XA<13>. Herein, since the row precharge pulse R3ACB_P is in a logic low level during an active operation duration, the NMOS transistor MN10 of the first driving unit 430 and the NMOS transistor MN11 of the second driving unit 435 are turned off.

After all, the first pre-decoding signal LAXD<0> and the second pre-decoding signal LAXD<1> that are outputted from the first latch unit 440 and the second latch unit 445 selectively transition to a logic high level according to the logic level of the row address XA<13>, and another signal maintains the logic low level. When the semiconductor memory device performs an initialization operation, the NMOS transistors MN12 and MN13 of the first reset unit 450 and the second reset unit 455 are temporarily turned on to reset all the output terminals of the first driving unit 430 and the second driving unit 435 to a logic low level. In the precharge operation before the receipt of the active command, the first latch unit 440 and the second latch unit 445 are initialized to a logic low level based on the row precharge pulse R3ACB_P that pulses in the logic high level.

Meanwhile, when a precharge command is applied, the row precharge pulse R3ACB_P is temporarily in a logic high level. Thus, the NMOS transistors MN10 and MN11 of the first driving unit 430 and the second driving unit 435 are turned on, and eventually, the first pre-decoding signal LAXD<0> and the second pre-decoding signal LAXD<1> that are outputted from the first latch unit 440 and the second latch unit 445 are all initialized to a logic low level regardless of the row address XA<13>.

The drawings show a case where the row address XA<13> is in a logic low level, and during the active operation, the first pre-decoding signal LAXD<0> is in a logic high level and the second pre-decoding signal LAXD<1> is in a logic low level. However, when the row address XA<13> is in a logic high level, the polarity of the signals becomes the opposite.

As described above, when the semiconductor memory device is set in the X4 mode or the X8 mode and performs a normal-mode operation, any one between the first pre-decoding signal LAXD<0> and the second pre-decoding signal LAXD<1> transitions to a logic high level. Therefore, a word line of the left block BLOCK_L or a word line of the right block BLOCK_R shown in FIG. 1 is selectively enabled according to the logic level of the first pre-decoding signal LAXD<0> and the second pre-decoding signal LAXD<1>.

To sum up, while the semiconductor memory device is set in the X4 mode or the X8 mode, the operation performed in the normal mode is almost the same as the operation of the conventional technology described earlier with reference to FIG. 3A.

Subsequently, FIG. 5B illustrates an operation in a refresh mode when the semiconductor memory device is set in the X16 mode, or when the semiconductor memory device is set in the X4 mode or the X8 mode.

Referring to FIG. 5B, when the active command is applied, the bank active pulse BAP is enabled to a logic high level, and then the row address enable pulse XAEP is enabled to a logic high level. Therefore, the first output signal of the input unit 400 is outputted in the same logic level as that of the row address XA<13>, and the second output signal of the input unit 400 is outputted in the opposite logic level to the logic level of the row address XA<13>.

When the semiconductor memory device is set in the X16 mode, the X16 mode signal SIG_X16 always maintains its logic state to be enabled in a logic high level. Also, when the semiconductor memory device is set in the X4 mode or the X8 mode, the X16 mode signal SIG_X16 is disabled to a logic low level, but the refresh signal REF is enabled to a logic high level during a refresh operation. Therefore, when the semiconductor memory device is set in the X16 mode or when the semiconductor memory device is set in the X4 mode or the X8 mode and the mode is a refresh mode, the mode control signal MODECTRL is in a logic low level while the first mode control unit 420 and the second mode control unit 425 output a signal of a logic low level regardless of the first and second output signals of the input unit 400.

Meanwhile, since the mode control signal MODECTRL is in a logic low level, the row precharge pulse R3ACB_P maintains its logic state in the logic low level, regardless of the transitioning of the row active signal R3ACB.

Therefore, the PMOS transistor MP10 of the first driving unit 430 and the PMOS transistor MP11 of the second driving unit 435 are turned on, and the NMOS transistor MN10 of the first driving unit 430 and the NMOS transistor MN11 of the second driving unit 435 are turned off.

After all, since the first pre-decoding signal LAXD<0> and the second pre-decoding signal LAXD<1> that are outputted from the first latch unit 440 and the second latch unit 445 all transition to a logic high level.

Meanwhile, although a precharge command is applied, the row precharge pulse R3ACB_P continuously maintains its logic state in the logic low level. Therefore, the first pre-decoding signal LAXD<0> and the second pre-decoding signal LAXD<1> that are outputted from the first latch unit 440 and the second latch unit 445 maintain their logic states in the logic high level, regardless of the row address XA<13>.

As described above, when the semiconductor memory device is set in the X16 mode, both of the first pre-decoding signal LAXD<0> and the second pre-decoding signal LAXD<1> are set in a logic high level, regardless of the operation mode.

Also, even though the semiconductor memory device is set in the X4 mode or the X8 mode and/or a bank is continuously activated/precharged, if the refresh operation is continuously performed, both of the first pre-decoding signal LAXD<0> and the second pre-decoding signal LAXD<1> are set in a logic high level. Herein, if the semiconductor memory device gets out of the refresh mode, it will perform the same operation as that of FIG. 5A.

Although the semiconductor memory device is set in the X16 mode, or although the semiconductor memory device is set in the X4 mode or X8 mode and a bank repeatedly performs active and precharge operations in a refresh operation duration, the first pre-decoding signal LAXD<0> and the second pre-decoding signal LAXD<1> are set to a logic high level, not causing unnecessary toggling. Therefore, it is possible to prevent unnecessary current consumption.

Figure 6:
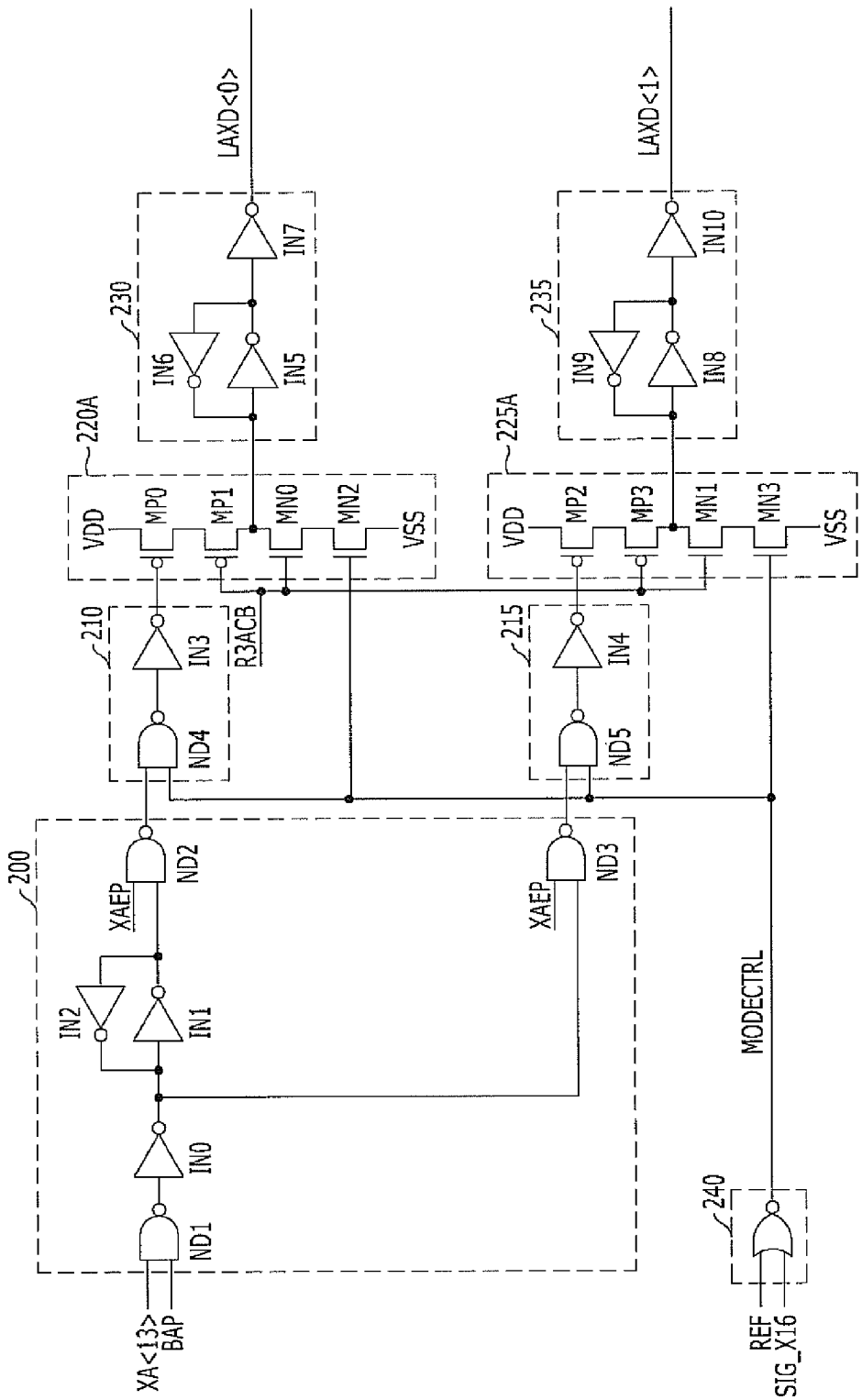
FIG. 6 is a circuit diagram of a row pre-decoding circuit in accordance with another embodiment of the present invention.

FIG. 6 is a circuit diagram of a row pre-decoding circuit in accordance with another embodiment of the present invention. The drawing shows a unit pre-decoding circuit that corresponds to the MSB of the entire pre-decoder.

Figure 2:
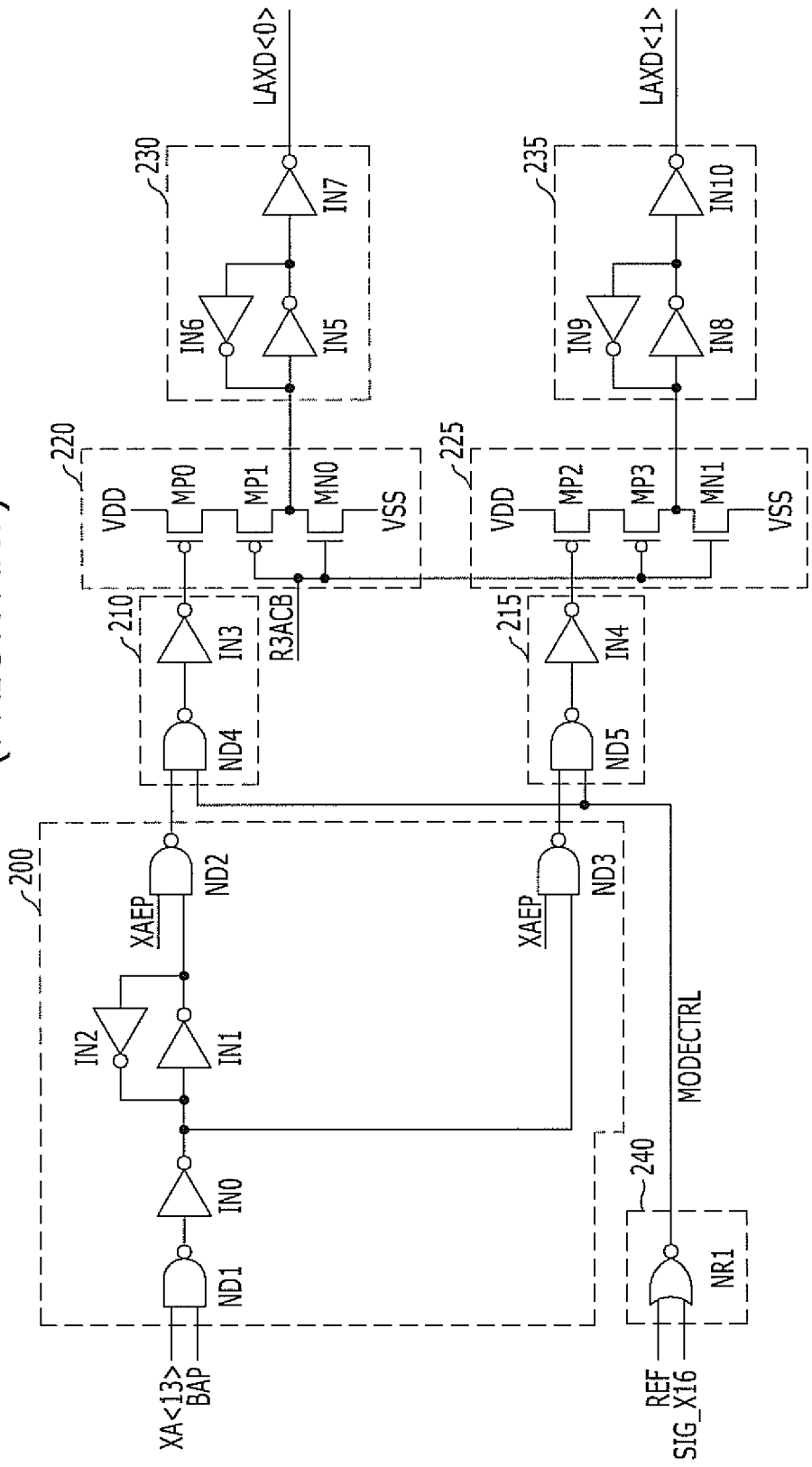
FIG. 2 is a circuit diagram illustrating a conventional row pre-decoder.

The row pre-decoding circuit in accordance with this embodiment of the present invention is basically similar to the conventional row pre-decoding circuit shown in FIG. 2. If there is any difference, NMOS transistors MN2 and MN3 controlled based on the mode control signal MODECTRL is added to the pull-down parts of first and second driving units 220A and 225A. The first driving unit 220A includes a pull-up element and a pull-down element. The pull-up element is controlled based on the row active signal R3ACB and the output signal of the first mode control unit 210, and the pull-down element is controlled based on the row active signal R3ACB and the mode control signal MODECTRL. The first driving unit 220A pull-up/pull-down drives an output terminal that corresponds to the first pre-decoding signal LAXD<0>.

The second driving unit 225A includes a pull-up element and a pull-down element. The pull-up element is controlled based on the row active signal R3ACB and the output signal of the second mode control unit 215, and the pull-down element is controlled based on the row active signal R3ACB and the mode control signal MODECTRL. The second driving unit 225A pull-up/pull-down drives an output terminal that corresponds to the second pre-decoding signal LAXD<1>.

Figure 3A:
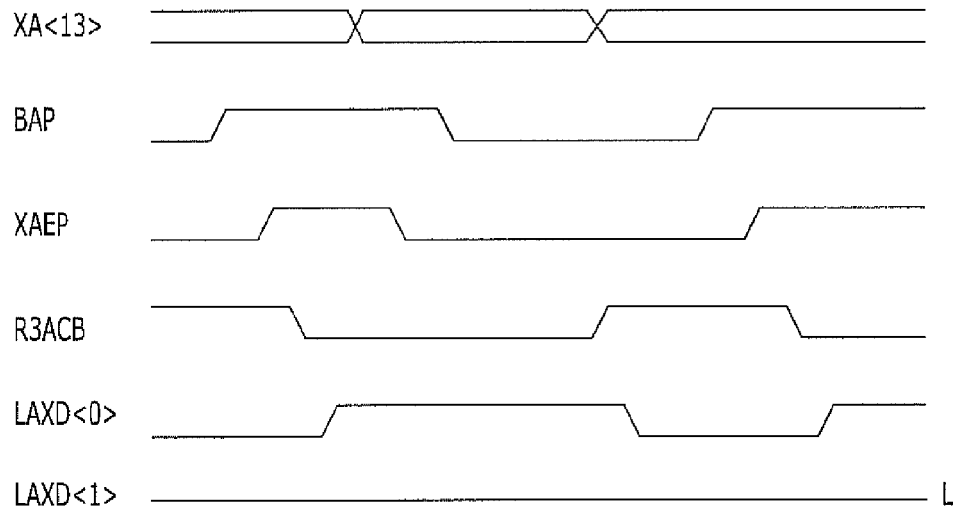
FIGS. 3A and 3B are timing diagrams of the row pre-decoding circuit illustrated in FIG. 2.
Figure 3B:
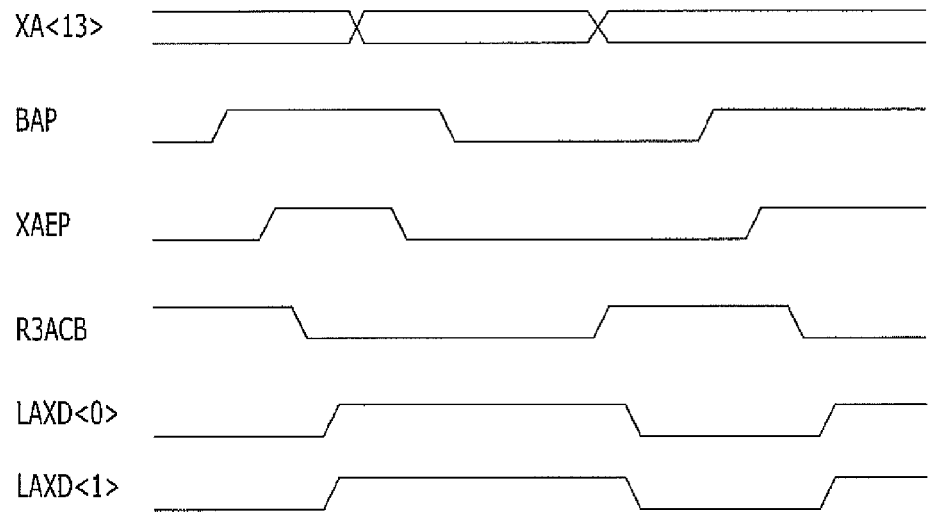

The normal-mode operation of the semiconductor memory device performed while the semiconductor memory device is set in the X4 mode or X8 mode is not different from that of FIG. 3A.

Since the mode control signal MODECTRL is in a logic high level, the NMOS transistors MN2 and MN3 of the first driving unit 220A and the second driving unit 225A continue to be turned on all the times.

Therefore, during an active operation, the first pre-decoding signal LAXD<0> and the second pre-decoding signal LAXD<1> are outputted in different logic levels according to the logic level of the row address XA<13>. Also, during a precharge operation, both of the first pre-decoding signal LAXD<0> and the second pre-decoding signal LAXD<1> are initialized to a logic low level, just as in the conventional technology.

Meanwhile, when the semiconductor memory device is set in the X16 mode, the NMOS transistors MN2 and MN3 of the first driving unit 220A and the second driving unit 225A are turned off; or although the semiconductor memory device is set in the X4 mode or the X8 mode, if the semiconductor memory device is in a refresh operation duration, the NMOS transistors MN2 and MN3 of the first driving unit 220A and the second driving unit 225A are turned off as well. This is because the mode control signal MODECTRL is in a logic low level.

Therefore, after both of the first pre-decoding signal LAXD<0> and the second pre-decoding signal LAXD<1> transition to a logic high level in an active operation, the logic level is not changed but maintained even in a precharge operation, too. This is because the NMOS transistors MN2 and MN3 of the first driving unit 220A and the second driving unit 225A are turned off and thus the pull-down path itself is disabled.

As described above, although the semiconductor memory device in accordance with the embodiment of the present invention is set in the X16 mode, or although the semiconductor memory device is set in the X4 mode or X8 mode and a bank repeatedly performs active and precharge operations in a refresh operation duration, the first pre-decoding signal LAXD<0> and the second pre-decoding signal LAXD<1> are set to a logic high level, not causing unnecessary toggling. Therefore, it is possible to prevent unnecessary current consumption.

Although not illustrated in the drawings, the semiconductor memory device in accordance with the embodiment of the present invention, too, may additionally include a first reset unit 450 and a second reset unit 455 shown in FIG. 4.

According to an embodiment of the present invention, the semiconductor memory device may reduce current consumption by preventing unnecessary toggling from being performed in a pre-decoding circuit.

While the present invention has been described with respect to the specific embodiments, it will be apparent to those skilled in the art that various changes and modifications may be made without departing from the spirit and scope of the invention as defined in the following claims.

For example, the transistors and logics used in the above-described embodiments of the present invention may be substituted by other transistors and logics according to the kind of the used signal of the enabling level of the used signal.

Also, the above embodiments of the present invention take an example of a case where a half page is selected based on the MSB of a row address. However, the technology of the present invention may be applied to a case where a half page is selected by using a particular bit that is not the MSB.

In addition, the embodiments of the present invention describe a case where a refresh signal that is enabled in a refresh duration and a signal corresponding to the uppermost option among the data input/output width options are used together as signals related to a mode for selecting a whole page. However, the technology of the present invention may be applied to a case where a mode control signal is generated by using any one between the two signals.

Furthermore, although the above embodiments of the present invention describes a case where the uppermost option among the data input/output width options is X16, the technology of the present invention may be applied to a case where the uppermost option is X32 or X64 as well.

What is claimed is:

1. A semiconductor memory device that selects a half page based on a particular bit of a row address, comprising:
    an input unit configured to receive the particular bit of the row address in response to a bank active pulse and a row address enable pulse;
    a control signal generation unit configured to output a mode control signal in response to a signal related to a mode for selecting a whole page;
    first and second mode control units configured to transfer a first output signal and a second output signal of the input unit that correspond to the particular bit of the row address and an inverse signal thereof, respectively, in response to the mode control signal;

a row precharge pulse generation unit configured to generate a row precharge pulse that is enabled in an initial period of a precharge duration in response to the mode control signal and a row active signal;

a first driving unit configured to pull-up/pull-down drive an output terminal that corresponds to a first pre-decoding signal in response to the row precharge pulse and an output signal of the first mode control unit;

a second driving unit configured to pull-up/pull-down drive an output terminal that corresponds to a second pre-decoding signal in response to the row precharge pulse and an output signal of the second mode control unit; and first and second latch units configured to latch output signals of the first driving unit and the second driving unit, respectively.

2. The semiconductor memory device of claim 1, further comprising:

a first reset unit configured to reset the first latch unit in response to a reset pulse; and a second reset unit configured to reset the second latch unit in response to the reset pulse.

3. The semiconductor memory device of claim 1, wherein the signal related to the mode for selecting the whole page is a signal corresponding to an uppermost option among data input/output width options.

4. The semiconductor memory device of claim 1, wherein the signal related to the mode for selecting the whole page is a refresh signal that is enabled in a refresh duration.

5. The semiconductor memory device of claim 1, wherein the signal related to the mode for selecting the whole page includes a signal corresponding to an uppermost option among data input/output width options, and a refresh signal that is enabled in a refresh duration.

6. The semiconductor memory device of claim 5, wherein the control signal generation unit includes:

a NOR gate that receives the signal corresponding to the uppermost option among the data input/output width options, and the refresh signal and outputs the mode control signal.

7. The semiconductor memory device of claim 6, wherein the uppermost option among the data input/output width options is an X16 mode.

8. The semiconductor memory device of claim 1, wherein the row precharge pulse generation unit includes:

a transferring element for selectively transferring the row active signal in response to the mode control signal;

an inverse delaying element for inversely delaying an output signal of the transferring element by a predetermined amount; and an output element for receiving the mode control signal, the output signal of the transferring element, and an output signal of the inverse delaying element and outputting the row precharge pulse.

9. The semiconductor memory device of claim 8, wherein the transferring element includes:

a NAND gate for receiving the mode control signal and the row active signal; and an inverter for receiving an output signal of the NAND gate.

10. The semiconductor memory device of claim 8, wherein the inverse delaying element includes an inverter chain that receives the output signal of the transferring element.

11. The semiconductor memory device of claim 8, wherein the output element includes:

a NAND gate that receives the mode control signal, the output signal of the transferring element, and the output signal of the inverse delaying element; and an inverter that receives an output signal of the NAND gate.

12. The semiconductor memory device of claim 1, wherein the first mode control unit includes:

a NAND gate that receives the first output signal of the input unit and the mode control signal; and an inverter that receives an output signal of the NAND gate.

13. The semiconductor memory device of claim 1, wherein the second mode control unit includes:

a NAND gate that receives the second output signal of the input unit and the mode control signal; and an inverter that receives an output signal of the NAND gate.

14. The semiconductor memory device of claim 1, wherein the first driving unit includes:

a PMOS transistor that includes a source coupled with a power source voltage terminal, a drain coupled with an output terminal, and a gate for receiving an output signal of the first mode control unit; and an NMOS transistor that includes a source coupled with a ground voltage terminal, a drain coupled with an output terminal, and a gate for receiving the row precharge pulse.

15. The semiconductor memory device of claim 1, wherein the second driving unit includes:

a PMOS transistor that includes a source coupled with a power source voltage terminal, a drain coupled with an output terminal, and a gate for receiving an output signal of the second mode control unit; and an NMOS transistor that includes a source coupled with a ground voltage terminal, a drain coupled with an output terminal, and a gate for receiving the row precharge pulse.

16. A semiconductor memory device that selects a half page based on a particular bit of a row address, comprising:

an input unit configured to receive the particular bit of the row address in response to a bank active pulse and a row address enable pulse;

a control signal generation unit configured to output a mode control signal in response to a signal related to a mode for selecting a whole page;

first and second mode control units configured to transfer a first output signal and a second output signal of the input unit that correspond to the particular bit of the row address and an inverse signal thereof, respectively, in response to the mode control signal;

a first driving unit configured to drive an output terminal that corresponds to a first pre-decoding signal, where the first driving unit includes a pull-up element that is controlled based on the row active signal and an output signal of the first mode control unit and a pull-down element that is controlled based on the row active signal and the mode control signal;

a second driving unit configured to drive an output terminal that corresponds to a second pre-decoding signal, where the second driving unit includes a pull-up element that is controlled based on the row active signal and an output signal of the second mode control unit and a pull-down element that is controlled based on the row active signal and the mode control signal; and first and second latch units configured to latch output signals of the first driving unit and the second driving unit, respectively.

17. The semiconductor memory device of claim 16, further comprising:

a first reset unit configured to reset the first latch unit in response to a reset pulse; and a second reset unit configured to reset the second latch unit in response to the reset pulse.

18. The semiconductor memory device of claim 16, wherein the signal related to a mode for selecting the whole page includes a signal corresponding to an uppermost option among data input/output width options, and a refresh signal that is enabled in a refresh duration.

19. The semiconductor memory device of claim 16, wherein the first driving unit includes:
 a first PMOS transistor that includes a source coupled with a power source voltage terminal and a gate for receiving an output signal of the first mode control unit;
 a second PMOS transistor that includes a source coupled with the drain of the first PMOS transistor, a drain coupled with an output terminal, and a gate for receiving the row active signal;
 a first NMOS transistor that includes a source coupled with a ground voltage terminal and a gate for receiving the mode control signal; and
 a second NMOS transistor that includes a source coupled with the drain of the first NMOS transistor, a drain coupled with the output terminal, and a gate for receiving the row active signal.

20. The semiconductor memory device of claim 16, wherein the second driving unit includes:
 a first PMOS transistor that includes a source coupled with a power source voltage terminal and a gate for receiving an output signal of the second mode control unit;
 a second PMOS transistor that includes a source coupled with the drain of the first PMOS transistor, a drain coupled with an output terminal, and a gate for receiving the row active signal;
 a first NMOS transistor that includes a source coupled with a ground voltage terminal and a gate for receiving the mode control signal; and
 a second NMOS transistor that includes a source coupled with the drain of the first NMOS transistor, a drain coupled with the output terminal, and a gate for receiving the row active signal.

* * * * *